United States Patent [19]
Katz

[11] Patent Number: 5,777,261
[45] Date of Patent: Jul. 7, 1998

[54] ASSEMBLY FOR ATTENUATING EMISSIONS FROM PORTABLE TELEPHONES

[76] Inventor: Joseph M. Katz, 11 Meadow Rd., Old Westbury, N.Y. 11568

[21] Appl. No.: 677,720

[22] Filed: Jul. 8, 1996

Related U.S. Application Data

[63] Continuation-in-part of Ser. No. 285,798, Aug. 4, 1994, Pat. No. 5,535,439, which is a continuation-in-part of Ser. No. 13,399, Feb. 4, 1993, Pat. No. 5,336,896.

[60] Provisional application No. 60/001,285 Jul. 21, 1995.

[51] Int. Cl.$^6$ ........................................ H05K 9/00
[52] U.S. Cl. ................... 174/35 R; 455/117; 455/128; 455/129; 455/90; 174/52.1
[58] Field of Search ................... 455/89, 90, 95, 455/347, 106, 128, 126, 127, 344, 66; 343/702, 841; 361/816, 818; 174/35 R, 35 C, 52.1; 250/515.1

[56] References Cited

U.S. PATENT DOCUMENTS

| | | | |
|---|---|---|---|
| 5,444,866 | 8/1995 | Cykiert | 455/89 |
| 5,493,702 | 2/1996 | Crowley et al. | 455/89 |
| 5,539,417 | 7/1996 | Terry et al. | 343/702 |
| 5,590,416 | 12/1996 | Rydbeck | 455/90 |

*Primary Examiner*—Kristine L. Kincaid
*Assistant Examiner*—Kristina Soderquist
*Attorney, Agent, or Firm*—Dilworth & Barrese

[57] ABSTRACT

An assembly for attenuating and diverting electromagnetic, radio frequency and microwave-radiation emitted from cellular and marine band telephones, which includes a completely lined EMI/RF and microwave radiation shielded protective case to fully enclose a cellular or marine band telephone, the case including at least two telescoping parts slidably connected to each other to permit insertion or extraction of a telephone, wherein an opening is formed in one of the at least two telescoping parts to permit operating the telephone inserted therein, and a shielded section formed in one of the at least two telescoping parts thereby preventing a base of the antenna from touching a users head during use; a telescoping antenna with a connector base adapted to engage antenna circuitry of a telephone; and a removable handle attached to the outside of the shielded case, the removable handle being configured and dimensioned to permit telescoping of the case and holding of the parts together for security and comfort.

1 Claim, 4 Drawing Sheets

5,777,261

1

ASSEMBLY FOR ATTENUATING EMISSIONS FROM PORTABLE TELEPHONES

This application claims priority to Provisional Application Ser. No. 60/001,285 filed Jul. 21, 1995, and is a continuation-in-part of application Ser. No. 08/285,798 filed Aug. 4, 1994, now U.S. Pat. No. 5,535,439, which is a continuation-in-part of application Ser. No. 08/013,399, filed Feb. 4, 1993, now U.S. Pat. No. 5,336,896.

BACKGROUND OF THE INVENTION

1. Field of the invention

The invention relates to providing some protection to the users of cellular telephones from the electro-magnetic radiation emitted therefrom and to provide a telescoping antenna with a tilt and swivel base to permit moving the antenna away from close contact with the users head when in use and to also supply a comfortable handle when carrying and in use.

2. Description of the prior art.

Cellular Telephone Users Protective Device by Joseph M. Katz U.S. Pat. No. 5,336,896 Aug. 8, 1994, U.S. Pat. No. 5,535,439 Jul. 9, 1996.

SUMMARY OF THE INVENTION.

There is much concern throughout the world that electro-magnetic fields radiation from cellular telephones and its antenna can cause damage to the brain, tuners and cancer due to the close contact of the telephone and its antenna to a persons head, when in use.

There are millions of these telephones in use. They are used in automobiles, by pedestrians, trucks, in offices and elsewhere. People walk in the street talking into them using small hand held portable cellular telephones. Due to its portability and long range it has become very popular and useful. It is a tremendous and growing industry.

Since the cellular telephone is small and lightweight and does not require a fixed wire it is portable and popular. However, since it is a telephone with an earphone and mouthpiece to talk into and an antenna to broadcast and receive the messages and uses portable electricity to operate it, it emits electromagnetic radiation which could be dangerous since it is used by placing the telephone in close contact against the side of the head from the ear to the mouth and the antenna touches or is close to the users head. That is an exposure. The antenna and the cellular telephone give off electro-magnetic radiation and being so close to the head and brain the danger is apparent.

There has been a recent scientific discovery that the brain contains a magnet. Therefore, it is believed that as one possibility the magnet in the brain attracts the emitted rays and has a detrimental effect on the brain cells, thereby, over a period of time, detrimental buildup might occur.

Because of the hazards involved and the clumsiness to use and carry the cellular telephone, this device was invented.

Its purpose is to provide a one piece lightweight protective electro-magnetic shielded jacket with 2 moving parts to contain the cellular telephone within it with a substitute outside telescoping antenna with a swivel and tilt base to permit the user to tilt, swivel and adjust the antenna away from the users head. The cellular telephones in current use have fixed straight antennas, which follows the direction of the cellular telephone which thereby rests or is in close contact with the users head. The current cellular telephones in use are either with a one piece fixed antenna or a one piece slide out type. There are no provisions for adjusting the antenna away from the head.

The invention is simple to use, the cellular telephone is permanently installed or removable, as desired. The operator simply unscrews the equipment antenna off the telephone then slides the telephone into the upper section of the electro-magnetic radiation shielded jacket then screws the special antenna into the telephone where the original equipment antenna was. The upper section of the invention is then slid into the lower radiation shielded section and the carry strap is connected. The telephone is now installed and ready to carry. When they desire to converse with the telephone they simply pull up the tilt, swivel and telescoping antenna, disconnect the carry strap, slide the 2 sections apart to expose the dialing mechanism of the telephone, dial the number wanted then slide the 2 sections together, refasten the carry strap, adjust the antenna to a position that faces the outer tip in a direction farthest from the head. They then talk and listen through the holes in the electro-magnetic shielded jacket. When the conversation is completed, the 2 sections are slid open, the power shut off, the 2 sections slid together and the strap fastened. When either carrying or talking and listening, they can hold the handle affixed to the jacket which provides safety from slippage and provides comfortable use.

1 is the tilt, swivel, telescoping antenna. 2 is the upper section of the invention. 3 is the lower section of the invention. 4 is hole to speak into. 5 are holes to listen. 6 is carry handle. 7 is a cellular telephone with the equipment antenna removed.

DESCRIPTION OF THE PREFERRED EMBODIMENTS

Figure 3:
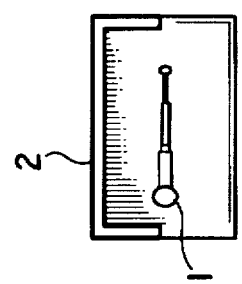
FIG. 3 is top view of the invention with tilt, swivel, telescoping antenna attached.
Figure 2:
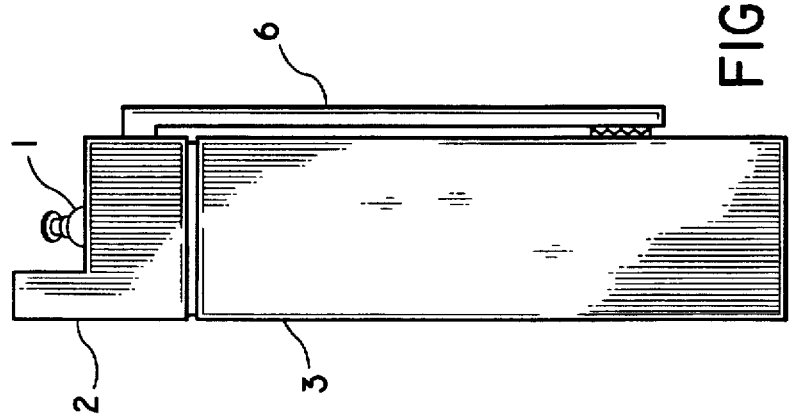
FIG. 2 is side view of the invention with carry handle attached.
Figure 1:
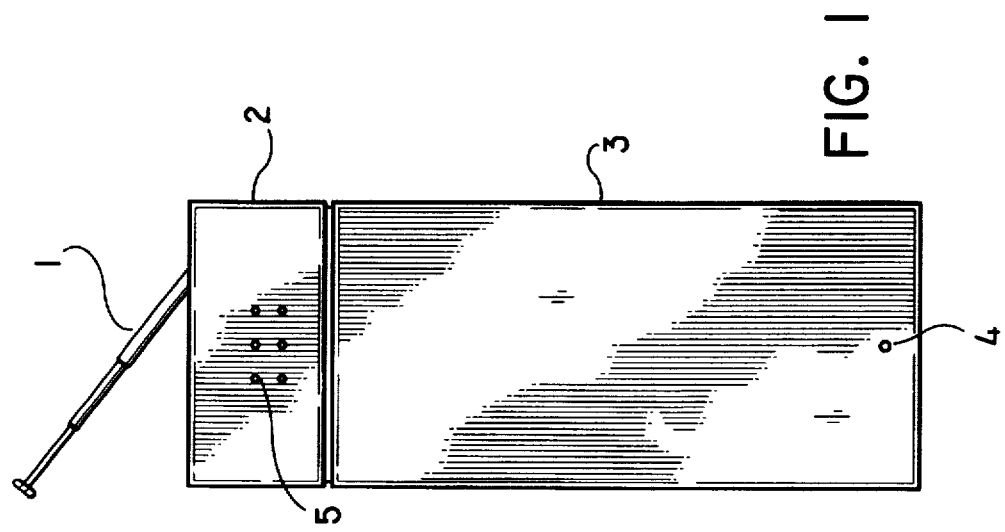
FIG. 1 is front view of the invention.
Figure 6:
FIG. 6 is the side view of the telephone container section of the invention.
Figure 5:
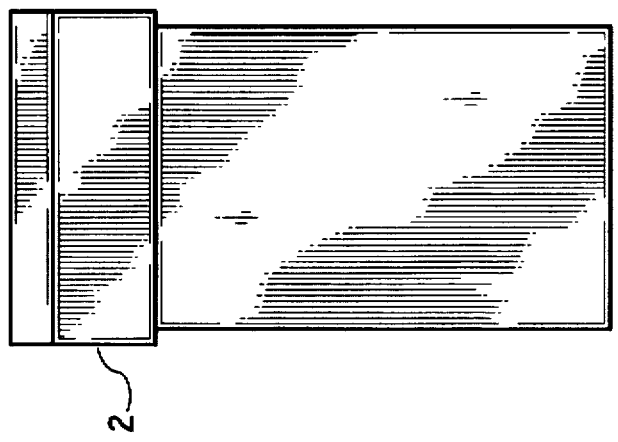
FIG. 5 is the rear view of the telephone container section of the invention.
Figure 4:
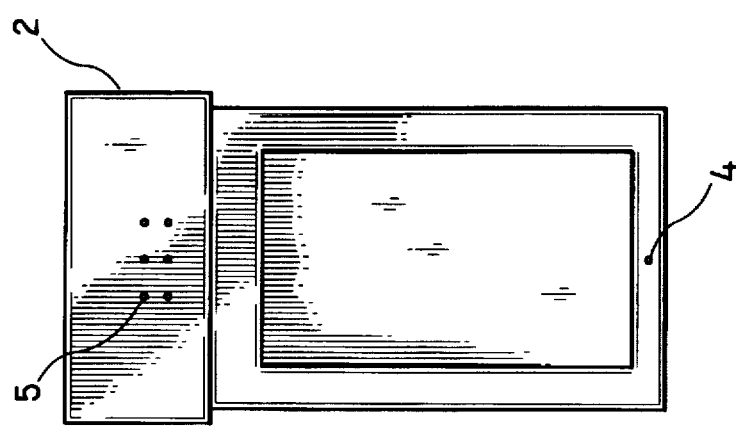
FIG. 4 is front view of the telephone container and upper section of the invention.
Figure 7:
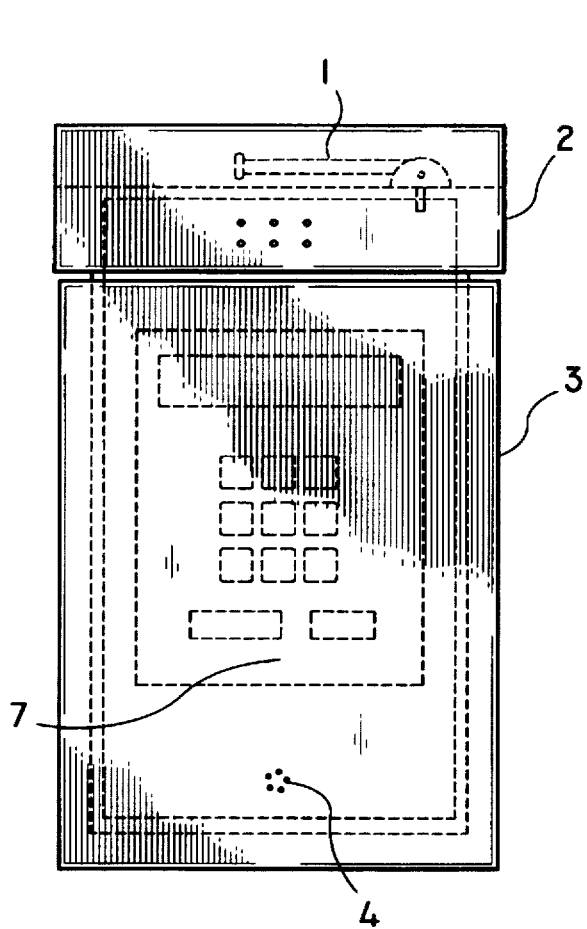
FIG. 7 is front view of the invention with a telephone installed.
Figure 8:
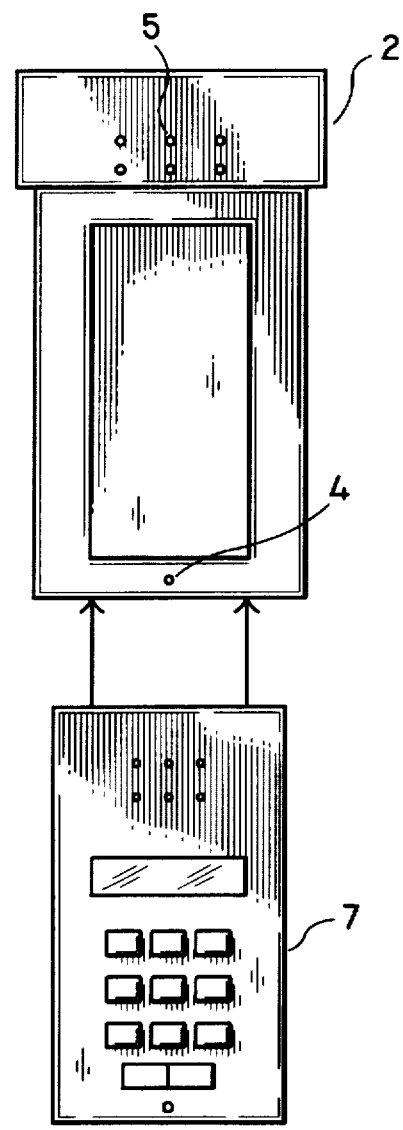
FIG. 8 is the method of telephone insertion into the invention.
Figures 9, 10:
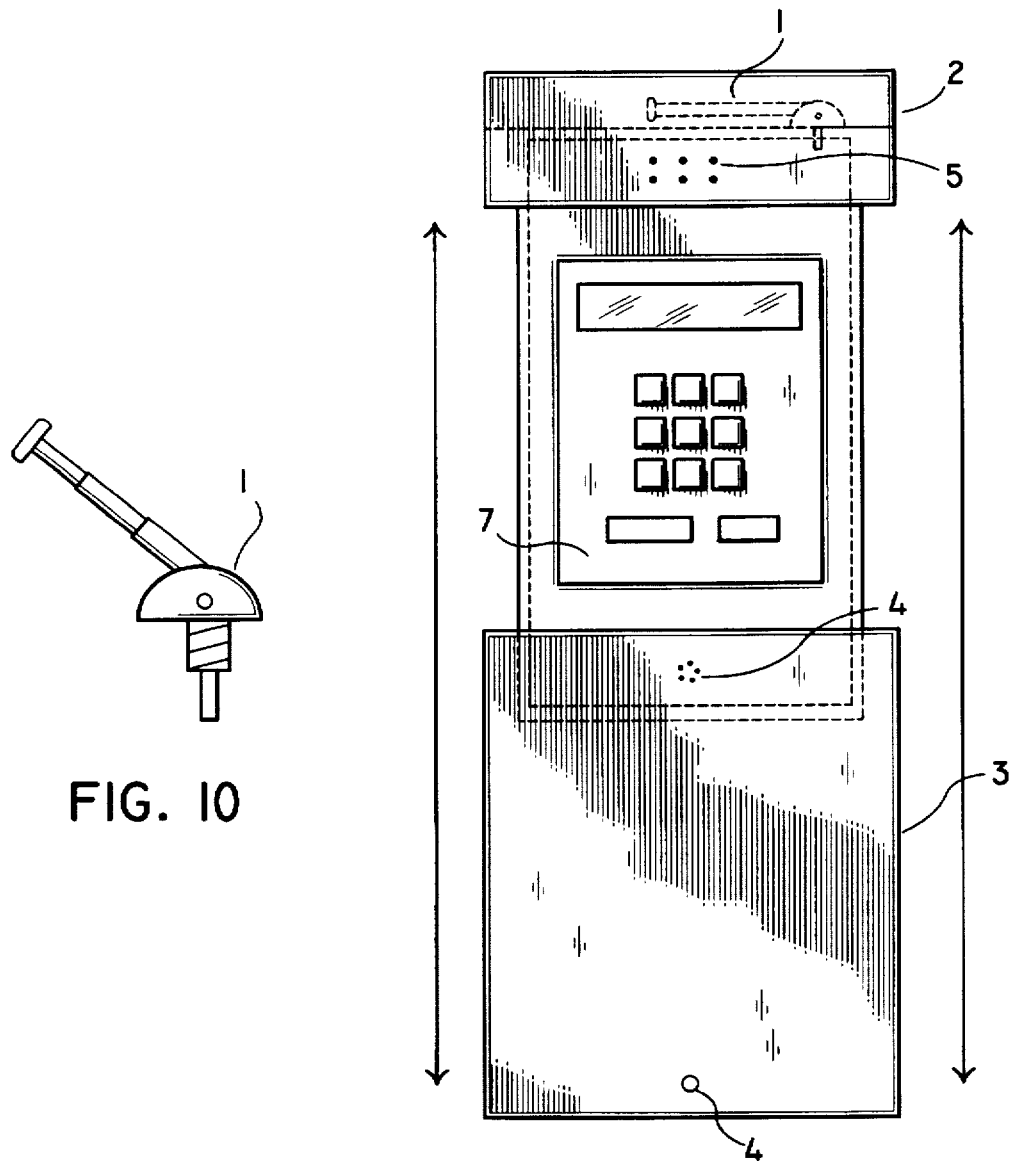
FIG. 9 shows the invention with the shielded case open.
FIG. 10 shows the tilt, swivel and telescoping antenna with connector.

The invention consists of a 2 part oblong box-like jacket closed at both ends FIG. 1. It has a handle 6 affixed to the rear side for holding the cellular telephone when talking or carrying FIG.2. It is made from either flexible or firm materials depending upon the users wants and is manufactured in both materials. In FIG. 4 the front of the upper jacket 2 has an open oblong section to accommodate viewing and using the dialing mechanism of the telephone with holes for hearing 5 and a hole for speaking 4. In FIG.5 shows the rear section of the upper jacket 2. In FIG. 6 shows the side section of the upper jacket 2. In FIG.7 shows the top section 2 installed into the bottom section 3 with a cellular telephone 7 and swivel telescoping antenna 1 installed therein. FIG. 8 shows how to install the telephone 7 into the upper jacket 2. Electro-magnetic radiation shielding is affixed on the inside to all sides, top and bottom of both jackets 2,3 completely covering the inside of both jackets 2,3 FIG. 1 and also to the inside extrusion of the upper jacket 2, FIG. 2 and 3. In FIG.3 on the outside top of the upper jacket 2 a telescoping antenna with a tilt and swivel base 1 is installed into the telephone at the telephone's antenna socket replacing the antenna furnished with the telephone when the telephone is installed into the upper jacket 2. FIG. 10 illustrates a tilt and swivel antenna of the present invention. In cases where it is not possible to unscrew the telephone equipment antenna the equipment antenna can be cut off at its base and a special connector can be attached to the cut off antenna base and the swivel telescoping antenna to form an antenna circuit for effecting antenna continuity.

The invention is an assembly for attenuating the passage of electro-magnetic radiation emitted from a cellular telephone comprising an electro-magnetic radiation shielding affixed to the entire inside of each of the 2 part oblong box and the inside of a protusion at the top of the upper box with holes for listening and speaking into and a hole at the top of the box to insert a tilt, swivel and telescoping antenna that provides for adjusting the antenna away from closeness to the operator's head to minimize the effects of the electromagnetic radiation from the antenna and from the cellular telephone. The jacket is in 2 parts. The telephone with equipment antenna removed is slid into the upper jacket with the dialing section facing the opening in the upper jacket. The tilt, swivel and telescoping antenna is then screwed into the telephone through the hole in the top of the upper jacket. The bottom section of the jacket is then slid onto the upper section the carry strap at the rear of the jacket is fastened and the telephone is then installed and ready for carrying. When the telephone is to be used the antenna is extended the carry strap is unfastened at the base and the bottom section of the jacket is slid downward to expose the dialing mechanism of the telephone.as seen in FIG. 9. The operator dials the number wanted slides the jacket parts together covering the dialing mechanism attaches the carry handle and swivels and adjusts the antenna to a position away from the operator's head and converses through the holes in the jacket. When the conversation is concluded the operator unfastens the carry handle slides the bottom section downward to expose the dialing mechanism turns off the telephone's power then slides the 2 sections together and fastens the carry strap.

Protection from electro-magnetic radiation and comfort are the functions of the invention.

The electro-magnetic shielding material is manufactured by many companies of diverse materials. The shielding material comes in powder mix form for coating the inside of the jacket. It comes in mesh. It comes in foil. It comes in treated plastics and treated metals and comes in other materials too. As long as the electro-magnetic shielding used attenuates to a high of 990 MHz it can be used effectively. There is a very extensive and competitive market producing EMI shielding that is obtainable for the purpose of the invention.

While various changes may be made in the detailed construction, such changes will be within the spirit and scope of the present invention.

I claim:

1. An assembly for attenuating and diverting electromagnetic, radio frequency and microwave-radiation emitted from cellular and marine band telephones, said assembly comprising:

a) a completely lined EMI/RF and microwave radiation shielded protective case to fully enclose a cellular or marine band telephone, the case including at least two telescoping parts slidably connected to each other to permit insertion or extraction of a telephone, wherein an opening is formed in one of the at least two telescoping parts to permit operating the telephone inserted therein, and a shielded section formed in one of the at least two telescoping parts thereby preventing a base of an antenna from touching a user's head during use;

b) said antenna being a telescoping, antenna with the base adapted to engage antenna circuitry of the telephone; and c) a removable handle attached to the outside of the shielded case, the removable handle being configured and dimensioned to permit telescoping of the case and holding of the parts together for security and comfort.

\* \* \* \* \*